United States Patent [19]

Ganzke et al.

[11] Patent Number: 4,853,727
[45] Date of Patent: Aug. 1, 1989

[54] PROCESS AND DEVICE FOR TREATING A PHOTOGRAPHIC RECORDING MATERIAL

[75] Inventors: Jürgen Ganzke, Dietzenbach; Dieter Jahn, Neu-Isenburg; Bruno Kritzner, Büttelborn, all of Fed. Rep. of Germany

[73] Assignee: E. I. Du Pont De Nemours and Company, Wilmington, Del.

[21] Appl. No.: 237,172

[22] Filed: Aug. 29, 1988

[30] Foreign Application Priority Data

Oct. 9, 1987 [DE] Fed. Rep. of Germany ....... 3734097

[51] Int. Cl.$^4$ .............................................. G03D 5/04
[52] U.S. Cl. .................................... 354/319; 354/317; 354/325
[58] Field of Search ............... 354/317, 319, 325, 318; 15/102; 430/322

[56] References Cited

U.S. PATENT DOCUMENTS

| | | | |
|---|---|---|---|
| 3,906,536 | 9/1975 | Graham | 354/325 |
| 3,973,847 | 8/1976 | Gygax | 354/325 |
| 4,081,577 | 3/1978 | Horner | 354/325 |
| 4,142,194 | 2/1979 | Hamlin | 354/318 |

FOREIGN PATENT DOCUMENTS

3328264C2  9/1984  Fed. Rep. of Germany .

Primary Examiner—A. A. Mathews

[57] ABSTRACT

Process and device for treating photosensitive recording material comprising a carrier layer and at least one photosensitive recording layer having a hardened image, e.g., halftone images, whereby undesirable streaks are eliminated particularly in halftone areas, the recording material while being transported flat is successively treated with washing agent in at least two separated wash sections by jets shaped and arranged so that each surface unit area of the recording layer is sequentially struck by at least two wash spray cones which do not contact each other prior to impacting the recording layer. The amount of washing agent impacting a unit area of the surface of the recording material per unit time and its impact velocity are selected so that only image free areas of the recording layer are removed. Halftone copies reproduction printing forms, etc., are produced.

18 Claims, 3 Drawing Sheets

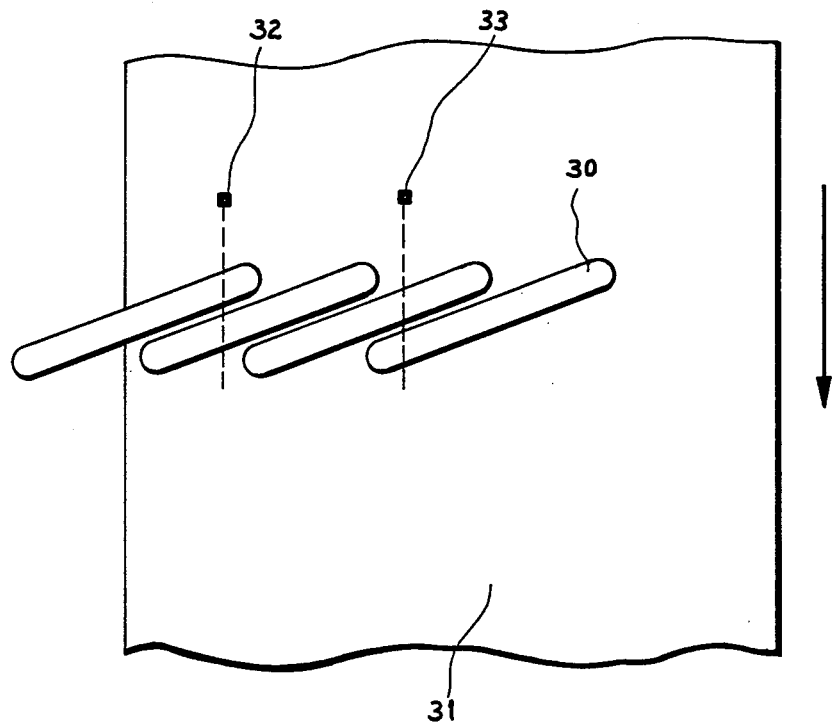

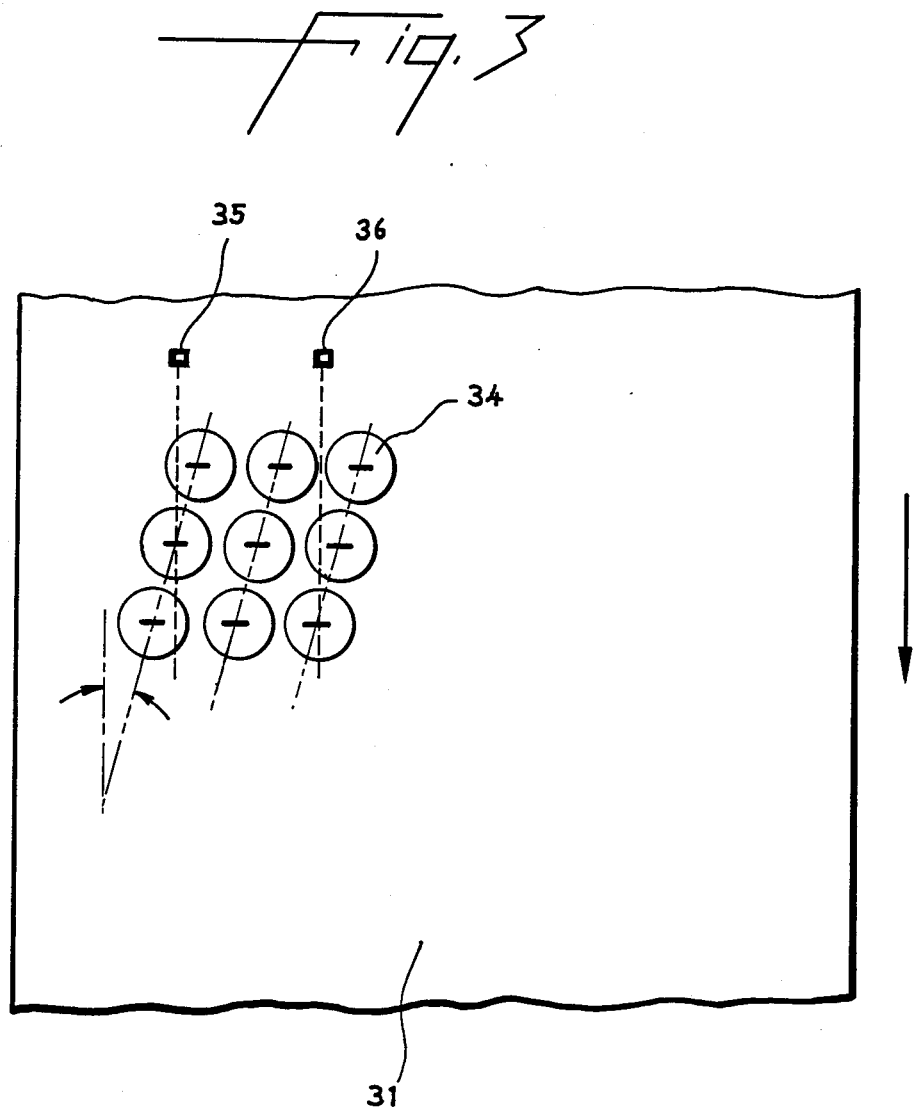

PROCESS AND DEVICE FOR TREATING A PHOTOGRAPHIC RECORDING MATERIAL

TECHNICAL FIELD

The invention relates to a process and a device for treating a photographic recording material by washing nonhardened areas of recording layers, hardened in the likeness of an image, arranged on a carrier layer.

BACKGROUND ART

Imagewise hardened recording layers can be produced, for example, by tanning development of silver halide emulsions in hydrophilic colloids, by photopolymerization of suitable light-sensitive compounds (usually negatives) or even on the basis of quinone diazide—novolak systems (mostly positives). In a known device for processing such photosensitive recording layers, e.g., as disclosed in Hamlin U.S. Pat. No. 4,142,194, the recording material is introduced into the device by a pair of rolls at the entrance side. While sliding over a film guide consisting of wires, the fluid washing agent is sprayed at high pressure and at high velocity from two rows of jets onto the recording layer of the recording material. The recording material then leaves the washing device by another pair of rolls.

If recording layers hardened in the likeness of an image are washed in the device as described the finished picture exhibits a more or less well recognizable series of streaks in the direction of transport through the washing device. In the case of line drawings or letter text the streaks are often hard to see and can be tolerated, but in halftone images the streaks are undesirable, especially when the halftones exhibit only low contrast and large areas of uniform tone.

It is therefore desirable to provide a process for treating a photosensitive recording material by washing which produces images free of defects described, such as streaks.

DISCLOSURE OF THE INVENTION

In accordance with this invention there is provided a process for treating a photosensitive recording material comprising a carrier layer and at least one photosensitive recording layer hardened in the likeness of an image wherein the areas of the recording layer which are free of any image are removed by treatment with washing agent, the recording material being conveyed beneath an arrangement of one or more rows of jets which spray the washing agent essentially vertically downward, the improvement wherein the recording material is sequentially conveyed essentially flat through at least two wash sections bounded by separating elements and separated from each other, each wash section provided with separate jet arrangements, the jets being shaped and arranged so that each surface unit area of the ecording layer is sequentially struck by at least two wash spray cones, the wash spray cones not coming into contact with each other prior to impacting the recording layer, and the amount of washing agent impacting a unit area of the recording material per unit time and its impact velocity are selected so that all image-free areas but none of the image-carrying areas of the recording layer are removed.

In accordance with an embodiment of this invention there is provided a device for carrying out the above-described process which comprises photosensitive recording material transport or support rolls arranged at the entrance and at the exit side bounding a working zone, a recording material transport guide, and at least one jet tube provided with essentially vertically downward directed jets, the improvement wherein (a) in the working zone is present at least one separating element by which at least two wash sections are formed, (b) the recording material transport guide is a continuous conveyor belt which is driven by the transport rolls at the entrance and/or exit side, (c) in each wash section at least one jet tube is present, the downward directed jets being arranged such that each surface unit area of the conveyor belt is impacted by at least two wash spray cones as it passes through a wash section but there is no contact between the wash spray cones prior to impacting the conveyor belt.

It has been found that that photosensitive recording layers hardened in the likeness of an image, e.g., by imagewise exposure to an actinic radiation source, can be washed without the formation of disturbing streak patterns if the recording material is washed as defined above using the defined device. As noted, the photosensitive recording material is sequentially conveyed through at least two wash sections bounded by separating elements, the wash sections being separated from each other. Each wash section is provided with separate jet arrangements. The separating elements do not need to enclose the wash sections but must prevent the washing agent, before or after striking the recording layer, from spilling from one wash section to another or into a region preceding or following the washing device. Especially suitable are rolls, resting on the recording layer and rotating in correspondence with the transport velocity of the recording material. Thus, for example, the rolls resting on the recording layer at the entrance and exit of the known washing device such as described in Hamlin U.S. Pat. No. 4,142,194 can serve to separate the first and last wash sections, respectively, from the outside, while additional rolls resting on the recording layer are arranged to separate the wash sections from each other. However, the wash sections can also be bounded and separated from each other by lips of elastic material or by air brushes. It is obvious that separating elements of different kinds can be combined in one washing device.

It is preferred to convey the recording material in the wash sections essentially horizontally. For flat and horizontal guidance, the recording material can rest on the horizontal section of a conveyor belt which is being moved through the washing device. The conveyor belt can consist of flexible material or even of links. To assure that the recording material and the conveyor belt are flat, it is useful to let the latter slide over flat tables within the wash sections. Conveyor belts and tables may contain holes as is known which enable washing agent to run off. Instead of individual tables it is advantageous to use a single table which extends over several wash sections.

As washing agents for washing recording layers based on hydrophilic colloids, e.g., gelatins, after tanning development, water or aqueous solutions are preferably used which are heated to a temperature clearly above the melting point of the corresponding hydrogels. For gelatin layers this temperature is suitably between 20° and 50° C. However, for other washable films, especially based on photopolymers, nonaqueous solvents at the proper temperature as known to those skilled in the art are useful.

An arrangement of jets for a wash section which, according to the invention, makes it possible for each unit area of the recording layer surface to be struck by at least two wash spray cones which, however, should not make contact with each other prior to impacting the recording layer, can, for example, be realized by several rows of jets positioned in sequence along the direction of transport, and displaced transverse to this direction. The spray cones are rotationally symmetric. Another preferred embodiment consists of a row of fan jets in which the largest diameters of the fans are rotated with respect to the direction of transport in such a way, and their distance is so dimensioned that the characteristic according to the invention, mentioned before, is fulfilled. Especially preferred is an arrangement in which the spray cones have a generating angle of 60 to 120 degrees in the direction of the largest diameter and the largest diameters form an angle of 75 to 85 degrees with the direction of transport.

To solve the problem of the formation of streaks it is generally not sufficient to spray the washing agent in a known manner at high pressure and at high velocity onto the recording layer. Impact velocity and amount of the washing agents striking the recording layer to be washed out per unit time per unit area should, rather, be chosen such that only the image-free, i.e., the non-hardened areas of the recording layer are removed and the image-carrying, i.e., the hardened areas remain completely retained in the recording material. Experiment has shown that impact velocities which are too high lead to partial washing out of hardened areas so that due to the generally nonuniform distribution of the impact velocity longitudinal streaks occur on the processed recording material which, opposite a defect-free image, are more or less brightened. Analogously, if the impact velocity is too low, dark longitudinal streaks are formed.

The suitable combination of impact velocity and amount of washing agent is naturally determined by the type of recording layer. For a silver halide emulsion layer based on gelatin, developed by tanning, the range of 15 to 30 m/second is preferred for the impact velocity and 0.8 to 2 ml per second and $cm^2$ for the amount of washing agent.

BRIEF DESCRIPTION OF THE DRAWINGS

In the accompanying drawings forming a material part of this disclosure:

FIG. 2 is a schematic view of the arrangement of areas of the recording layer struck by individual wash spray cones of a row of fan jets, and FIG. 3 is a schematic view of the arrangement of areas of the recording layer struck by wash spray cones of three rows of circular jets.

Figure 1:
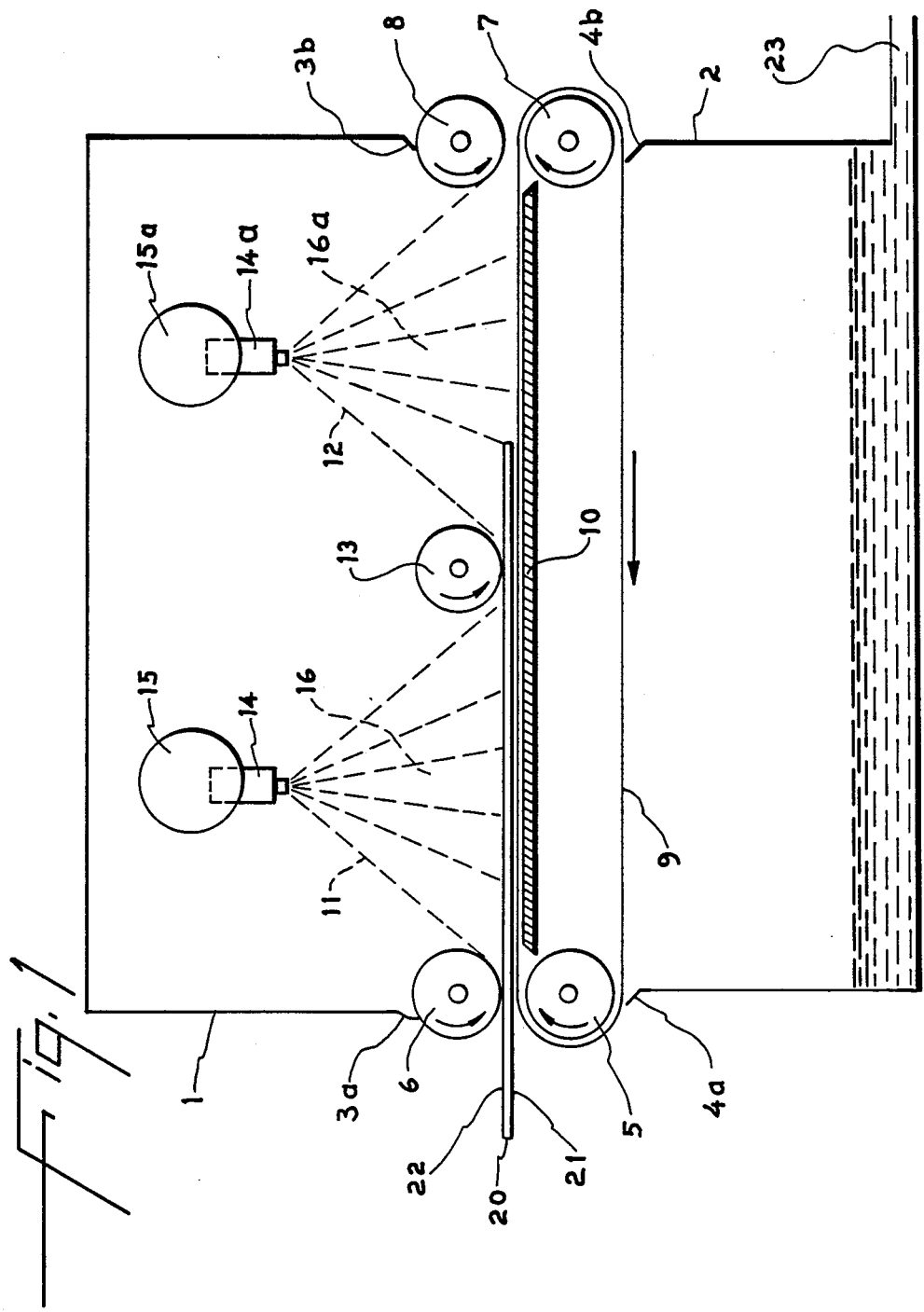
FIG. 1 is a cross-section, elevation view of a device of the invention suitable for carrying out a process of the invention.

The washing device is generally integreated with devices for other stages of the treatment, e.g., developing and drying, not shown in FIG. 1 to form a treating unit. The washing device is placed in a housing consisting of an upper part 1 and a lower part 2. Both parts are provided with flexible lips 3a and 3b and 4a and 4b, respectively, to seal off splashes of washing agent. At the entrance to the washing device there are two rotating rolls 5 and 6, at least one of which is spring supported so that the space between them closes automatically and enough frictional force for transport is transferred to the recording material 20 to be washed out. At the exit of the device two rotating rolls 7 and 8 are present, at least one of which is spring mounted. An endless conveyor belt 9 runs over rolls 5 and 7; this belt consists of a flexible material which slides over a stationary table 10 with a horizontal surface. There are two wash sections 11 and 12 in the device separated by a spring supported roll 13. This roll rests on the conveyor belt 9 and the recording material 20, respectively, and is thus put into rotation. A layer of washing agent present in wash section 11 is thus removed before the recording material enters wash section 12. Approximately in the center of wash section 11 a jet tube 15 is provided above the conveyor belt 9 which carries a row of fan jets 14 which spray the washing agent in the form of spray cones 16 downward onto the conveyor belt 9 and the recording material 20 resting on it, respectively. Thus, non-hardened parts of the recording layer 22 adhering to the carrier layer 21 are dissolved and flushed away by the washing agent. Analogously, a jet tube 15a with a row of jets 14a is present in the second wash section 12. Washing agent in the form of spray cones 16a is sprayed downward onto the conveyor belt 9 and the recording material 20 resting on it. The washing agent then drops over the edge of the conveyor belt 9 or even through holes in the conveyor belt and in the table 10 into the lower part 2 of the housing and leaves the latter through a drain 23. It can then be discarded or treated by filters and heating elements not shown here and be returned to jet tubes 15 and 15a by means of a pump.

FIG. 2 shows the areas 30 on the recording layer struck by the individual spray cones of the fan jets of a wash section. It can be seen that each unit area of the surface 31, for example, unit areas 32 and 33, is successively impacted by at least two wash spray cones when the recording material moves in the direction of the arrow.

FIG. 3 shows a possible arrangement of circular jets. These are mounted on three jet tubes in such a way that the jets of each jet tube are displaced opposite those of the other jet tubes in a direction normal to the direction of transport of the conveyor belt by one third of their distance in that direction. Here, too, for example, the unit areas 35 and 36 of surface 31 are impacted by at least two wash spray cones 34.

BEST MODE FOR CARRYING OUT THE INVENTION

The best mode of the invention is illustrated in the Example below.

INDUSTRIAL APPLICABILITY

The invention is useful in developing photosensitive recording materials of any kind having washable recording layers hardened in the likeness of an image, especially negative or positive copying film and printing plates based on hydrophilic colloid, e.g., silver halide, or photopolymerizable compositions.

The following example is intended to further illustrate but not limit the process according to the invention.

EXAMPLE

A photographic recording material suitable for developing by tanning and for washing was prepared in the same manner as the comparison film in Example 1 of EP No. 128,836 and exposed in contact with a fifty percent halftone (60 lines/cm). Processing was carried out in an integrated treating unit in which the recording material was transported with the aid of transport rolls sequentially through an activation, washing and drying section. The washing sction of the device was constructed corresponding to FIG. 1 but the parameters essential to the invention could be varied. Activation occurred for 15 seconds in an activator at 40° C., fixing for 15 seconds in a fixing bath of 25° C. The composition of the baths is also given in Example 1 of the European Patent Application referred to above. After washing, the recording material was dried for 20 seconds in a stream of air at 55° C. Initially the arrangements of the structural elements of the washing device corresponded to that of FIG. 1. Here, the distance of the jet tubes 15 and 15a from the conveyor belt was 70 mm, the distance of roll 13 from rolls 6 and 8 was 100 mm each and the distance between two neighboring fan jets on a jet tube was 25 mm each. Water at a temperature of 35° C. served as washing agent which was sprayed onto the recording layer at a velocity of 22 m/seconds and in an amount of 1.5 ml per second and cm². The speed of the conveyor belt was 0.03 m/second The pressure exerted by the spray jets on the conveyor belt and the recording layer, respectively, was ca. 300 Pa. The largest diameters of the spray cones formed an angle of 80 degrees with the direction of transport. Under these conditions a completely uniform halftone of 50% was obtained.

The above procedure was repeated with the following changes being made, which produced the indicated defects in the processed record material:

| Change | Defect |
| --- | --- |
| 1. Shut-down of one or both jet tubes | Dark longitudinal streaks at the distance of the jets |
| 2. Reduction in spray velocity and amount of water by 50%. | Dark longitudinal streaks at the distance of the jets |
| 3. Increase in spray velocity and amount of water by 100%. | Irregular bright spots |
| 4. Adjustment of fan jets at an angle of 90 degrees to the direction of transport (spray cones are making contact prior to impact) | Bright and dark longitudinal streaks |
| 5. Replacement of conveyer belt 9 and table 10 by wires stretched in the direction of transport | Dark longitudinal streaks at the distance of the wires; scratches on the reverse side |
| 6. Removal of roll 13 | Bright and dark spots; fluttering and/or floating up of the recording material; interruption of transport |

The results of this experiment show that defect-free pictures are obtained only by the combined action of the characteristics according to the invention.

We claim:

1. A process for treating a photosensitive recording material comprising a carrier layer and at least one photosensitive recording layer hardened in the likeness of an image wherein the areas of the recording layer which are free of any image are removed by treatment with washing agent, the recording material being conveyed beneath an arrangement of one or more rows of jets which spray the washing agent essentially vertically downward, the improvement wherein the recording material is sequentially conveyed essentially flat through at least two wash sections bounded by separating elements and separated from each other, each wash section provided with separate jet arrangements, the jets being shaped and arranged so that each surface unit area of the recording layer is sequentially struck by at least two wash spray cones, the wash spray cones not coming into contact with each other prior to impacting the recording layer, and the amount of washing agent impacting a unit area of the recording material per unit time and its impact velocity are selected so that all image-free areas but none of the image-carrying areas of the recording layer are removed.

2. A process according to claim 1 wherein the photosensitive recording layer consists of an imagewise exposed negative or positive photopolymerizable layer.

3. A process according to claim 1 wherein the photosensitive recording layer consists of an imagewise exposed and tanning developed silver halide emulsion layer.

4. A process according to claim 1 wherein rotating rolls, resting on the recording layer to be washed, are used as separating elements.

5. A process according to claim 1 wherein the recording material is conveyed essentially horizontally during washing.

6. A process according to claim 1 wherein the recording material during washing rests on the horizontal part of a moving conveyor belt.

7. A process according to claim 6 wherein the conveyer belt is supported in the wash regions by a horizontal table.

8. A process according to claim 7 wherein the conveyor belt and/or the table exhibit holes to permit washing agent to pass through.

9. A process according to claim 1 wherein the washing agent is water or an aqueous solution.

10. A process according to claim 9 wherein the water or the aqueous solution has a temperature of 20° to 50° C.

11. A process according to claim 1 wherein the jets are fan spray jets.

12. A process according to claim 11 wherein the generating angle of the fan spray jet spray cones in the direction of their largest diameters is 60 to 120 degrees.

13. A process according to claim 11 wherein the direction of the largest diameters of the fan spray jet spray cones makes an angle with the direction of transport of the recording material of 75 to 85 degrees.

14. A process according to claim 1 wherein the washing agent is sprayed onto the recording layer at a velocity of 15 to 30 m/seconds and in an amount of 0.8 to 2 ml per second and cm².

15. A process according to claim 1 wherein the recording layer contains a halftone image.

16. A device for carrying out the process according to claim 1 which comprises photosensitive recording material transport or support rolls arranged at the entrance and at the exit side bounding a working zone, a recording material transport guide, and at least one jet tube provided with essentially vertically downward directed jets, the improvement wherein (a) in the working zone is present at least one separating element by which at least two wash sections are formed, (b) the recording material transport guide is a continuous conveyor belt which is driven by the transport rolls at the entrance and/or exit side, (c) in each wash section at least one jet tube is present, the downward directed jets being arranged such that each surface unit area of the conveyor belt is impacted by at least two wash spray cones as it passes through a section wash but there is no contact between the wash spray cones prior to impacting the conveyor belt.

17. A device according to claim 16 wherein a jet tube is present in at least one wash section which is provided with fan spray jets in which the largest diameter of the spray cones makes an angle of 75 to 85 degrees with the running direction of the conveyor belt and the generating angle of the spray cones in the direction of the largest diameter is 60 to 120 degrees.

18. A device according to claim 16 wherein the jets are circular spray jets and that in at least one wash section three jet tubes are arranged so that the jets of each jet tube opposite those of the other jet tubes are displaced in a direction vertical to the direction of transport of the conveyor belt by one third of their distance of separation in this direction.

* * * * *